United States Patent [19]
Nagata et al.

[11] Patent Number: 5,527,630
[45] Date of Patent: Jun. 18, 1996

[54] BATTERY CHECK APPARATUS

[75] Inventors: Toshio Nagata, Yokohama; Hidenori Taniguchi, Sagamihara, both of Japan

[73] Assignee: Canon Kabushiki Kaisha, Tokyo, Japan

[21] Appl. No.: 216,627

[22] Filed: Mar. 23, 1994

[30] Foreign Application Priority Data

Mar. 26, 1993 [JP] Japan .................................. 5-090517

[51] Int. Cl.⁶ .................................................. H01M 10/46
[52] U.S. Cl. .................................. 429/7; 429/61; 429/93; 354/484
[58] Field of Search .................................. 429/7, 61, 92, 429/93; 354/468, 484

[56] References Cited

U.S. PATENT DOCUMENTS

| | | | |
|---|---|---|---|
| 3,886,443 | 5/1975 | Miyakawa et al. | 354/484 X |
| 4,072,960 | 2/1978 | Meixner | 354/468 |
| 4,251,151 | 2/1981 | Toyota | 354/468 |
| 4,522,480 | 6/1985 | Kawabata et al. | 354/468 |
| 4,751,545 | 6/1988 | Iguchi | 354/468 |
| 5,284,719 | 2/1994 | Landam et al. | 429/93 X |

FOREIGN PATENT DOCUMENTS 50-26133  8/1975  Japan .

*Primary Examiner*—Stephen Kalafut
*Attorney, Agent, or Firm*—Robin, Blecker, Daley & Driscoll

[57] ABSTRACT

This invention relates to a battery check apparatus comprising an effecting circuit for effecting the power supply battery to decrease an internal resistance of the battery power supply and a check circuit for checking a battery life of the power supply battery after the operation of the effecting circuit.

90 Claims, 8 Drawing Sheets

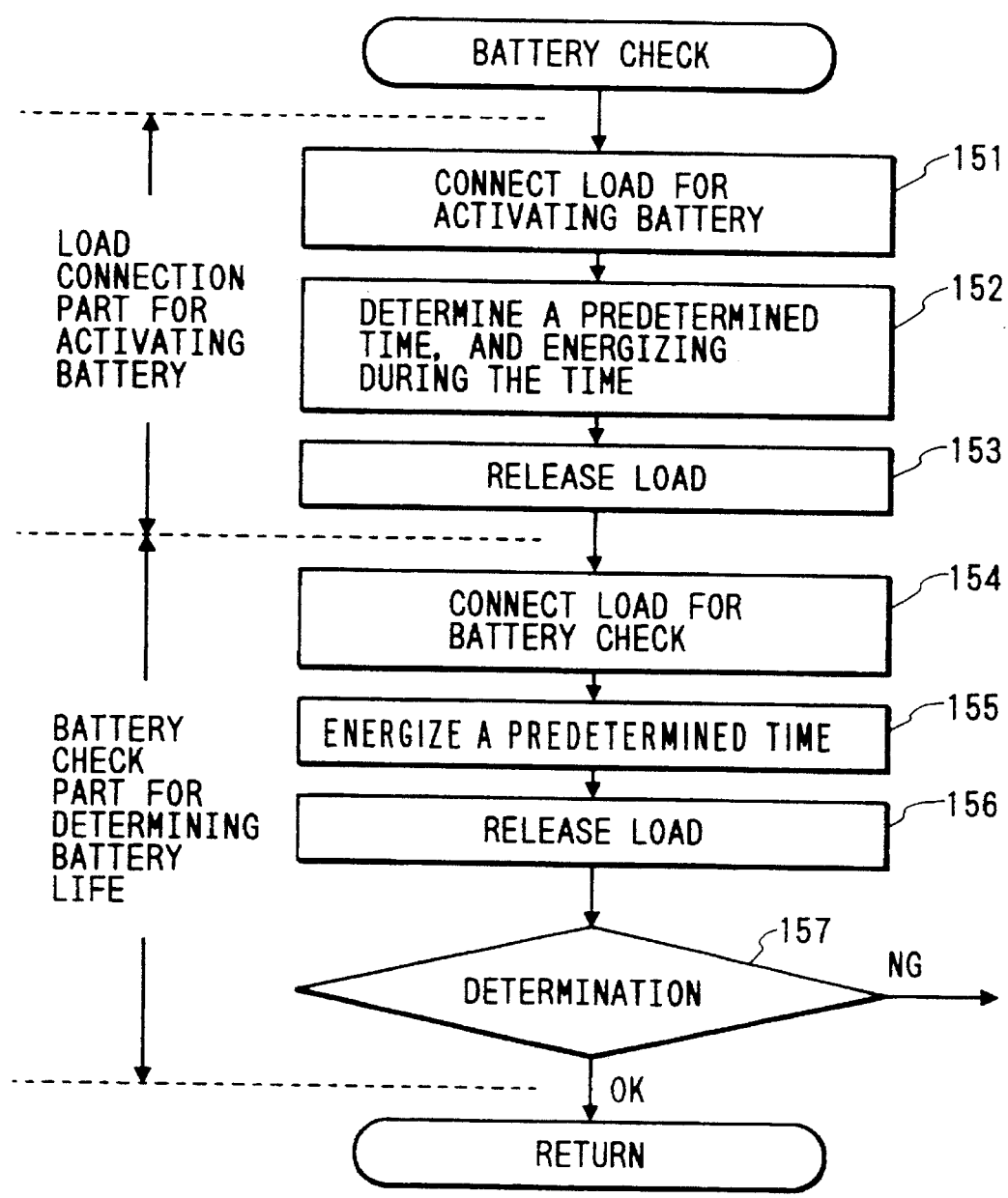

BATTERY CHECK APPARATUS

BACKGROUND OF THE INVENTION

1. Field of the Invention

This invention relates to improvements of a battery check apparatus provided at a battery-powered apparatus.

2. Related Background Art

In a conventional method of checking a power supply battery, generally a load is simulated to be connected to the battery for a short time to detect a voltage drop across the battery. Almost all of batteries today, however, do not contain toxic mercury compounds unlike the former ones due to a part of measures for environmental protection, and it has turned out that an internal resistance of this type of batteries is higher at their initial use (that is, new batteries) due to a chemical change (temporary oxidation) of their internal substances. Subsequently the internal resistance is lowered gradually to a normal level if the battery is continued to be used, and then it is increased again owing to battery drain.

Accordingly, the conventional method has a problem in application in that it is determined that a life of a new battery is insufficient when it is initially used in spite of its sufficient life due to a higher internal resistance with the subsequent sequence not continued, so that a user considering it to be defective loads an electronic apparatus with another new one.

SUMMARY OF THE INVENTION

It is one aspect of the present invention to provide a battery check apparatus which comprises decreasing means for decreasing the internal resistance of a power supply battery and check means for checking a life of the power supply battery after employing the decreasing means so as to check the life thereof exactly.

Other aspects of this invention will be apparent from the following detailed description of the preferred embodiments.

BRIEF DESCRIPTION OF THE DRAWINGS

FIG. 3 is a flowchart illustrating a battery check operation shown in FIG. 2.

DETAILED DESCRIPTION OF THE PREFERRED EMBODIMENT

Preferred embodiments of the present invention will be described with reference to the accompanying drawings.

Figure 1:
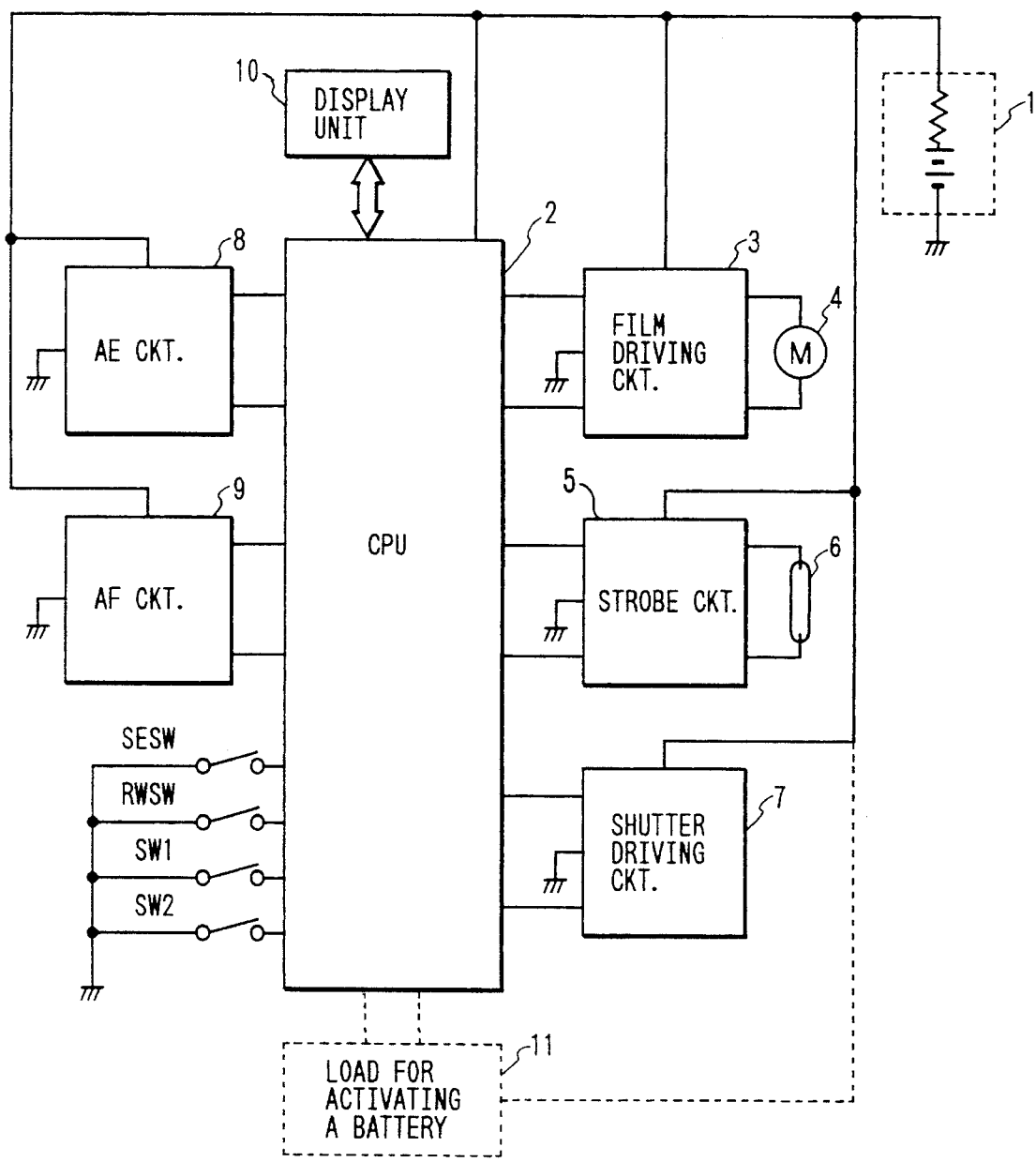
FIG. 1 is a block diagram illustrating main components of a camera comprising a battery check apparatus according to the first embodiment of the present invention.

Referring to FIG. 1 which is a block diagram illustrating the main components of a camera comprising a battery check apparatus according to the first embodiment of the invention, a battery 1 is a power supply for a camera including no mercury compounds (hereinafter referred to "non-mercury battery" in the description of the embodiments), a CPU 2 controls various circuits in the camera with a ROM containing programs and a RAM stored with contents of various flags or the like, a film driving circuit 3 drives a film feeding motor 4 for winding or rewinding films, the numeral 5 indicates an already known strobe circuit, a xenon tube 6 emits flashlight under the control of the strobe circuit 5, a shutter driving circuit 7 opens or closes a shutter (not shown), an AE circuit 8 is used for photometry of the luminance on an object with a photometric sensor which is not shown, an AF circuit 9 is used for detecting a distance between the camera and the object (or a defocused status of a photo-taking lens) by using a distance sensor which is not shown, a display unit 10 comprising a liquid crystal displays various kinds of photo-taking information and warnings, a switch SW1 is turned on with the first stroke of a release button which is not shown, a switch SW2 is turned on with the second stroke of the release button which is not shown, a rewinding switch RWSW is used to rewind a film forcibly, a self-timer switch SESW is used to activate a self-timer.

Figure 2:
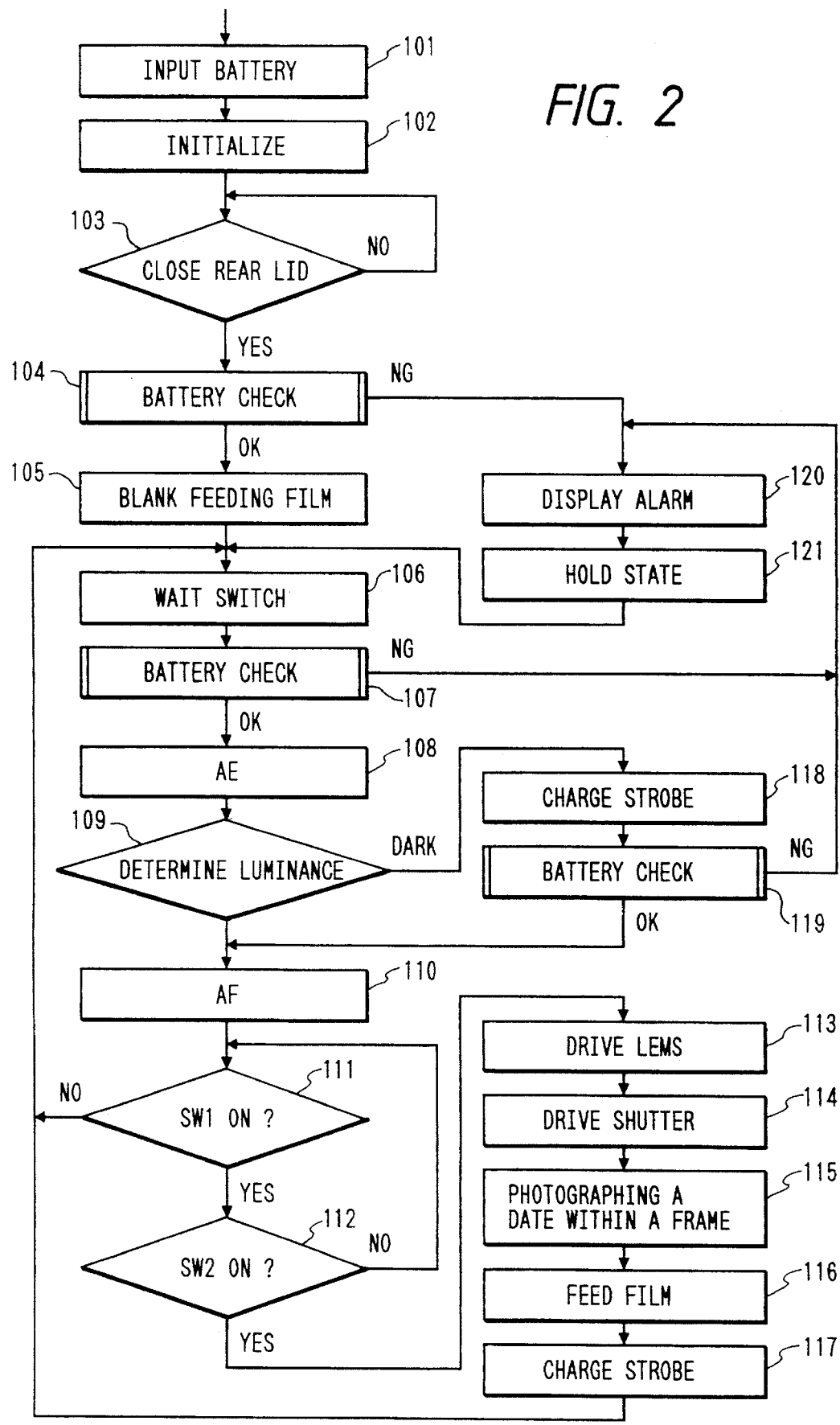
FIG. 2 is a flowchart illustrating operations of a CPU shown in FIG. 1.

Referring to FIG. 2, there is shown a flowchart of operations performed by the above-described CPU 2 and the details are described below according to it.

[Step 101]

When a battery chamber of the camera is loaded with the non-mercury battery 1, the control progresses to step 102. It supplies power to various circuits in the camera.

[Step 102]

Various types of flags are initialized (reset).

[Step 103]

After film loading, it is determined whether or not a rear lid is closed. If it is not closed, the control remains in this step. Otherwise, the control progresses to step 104.

[Step 104]

In step 104, the CPU executes a subroutine for the battery check operation including the battery activating operation. The details are described later referring to FIG. 3. If it is determined that the battery has sufficient voltage for the subsequent operations (OK) as a result of the battery check, the control progresses to step 105. Otherwise (NG), the control progresses to step 120.

[Step 105]

Since it is determined that the battery voltage is sufficient for the subsequent operations after the battery check, a blank feeding film operation is carried out via the film driving circuit 3 and the film feeding motor 4.

[Step 106]

In step 106, the CPU waits for the switch SW1, the self-timer switch SESW, the rewinding switch RWSW, or other switches to be turned on with the first stroke of the release button.

The operation is described here assuming that the SW1 is turned on. If the switch SW1 is turned on, the control progresses from step 106 to step 107.

[Step 107]

In the same manner as for the above step 104, the CPU executes a subroutine for the battery check operation including the battery activation. If the battery voltage is determined to be sufficient (OK) as a result of the battery check, the control progresses to step 108. Otherwise (NG), it progresses to step 20.

[Step 108]

In step 108, the AE circuit 8 is activated to obtain object luminance information.

[Step 109]

It is determined whether or not the object is dark enough to need strobe light from the above object luminance information. If it is so, the control progresses to step 118. Otherwise, it progresses to step 110.

[Step 110]

In step 110, the AF circuit 9 is activated to detect a distance between the camera and the object (or a defocused status of the photo-taking lens).

[Step 111]

In step 111, a status of the switch SW1 is determined. If it is turned off, the control returns to the step 106. If it is halfway or in the ON position, the control progresses to step 112.

[Step 112]

In step 112, a determination is made for a status of the switch SW2 which is turned on with the second stroke of the release button. If it remains off, the control returns to the step 111 to repeat the same operation. If it is on, the control progresses to step 113.

[Step 113]

The focus adjustment lens not shown is driven onto a focused position on the basis of the information obtained in the step 110.

[Step 114]

In step 114, the shutter (not shown) is opened or closed through the shutter driving circuit 7 on the basis of the information obtained in the step 108.

[Step 115]

Date information such as a year, month, and day is photographed in a predetermined position within a photo-taking frame.

[Step 116]

The film containing photo-taking frames is rewound through the film driving circuit 3 and the film feeding motor 4.

[Step 117]

A strobe charge start signal is output to the strobe circuit 5 and the strobe is charged in preparation for a subsequent photo-taking. Subsequently, if a strobe charge completion signal is entered by the circuit 5, the control returns to the step 106 and the CPU enters a wait state for various switches to be turned on.

If it is determined that the object is dark enough to need the strobe light according to the object luminance information in the step 109, the control progresses from the step 109 to step 118 as described above.

[Step 118]

In step 118, a strobe charge start signal is output to the strobe circuit 5, and then the control progresses to the subsequent step 119 in which the strobe charge completion signal is entered by the circuit 5.

[Step 119]

The CPU executes a subroutine of the battery check operation including the battery activation in the same manner as for the above steps 104 and 107. If the battery voltage is determined to be sufficient (OK) as a result of the operation, the control returns to the step 110 for the AF operation. Otherwise (NG), it progresses to step 120.

If the battery voltage is determined to be insufficient (NG) in the above steps 104, 107, and 119, the control progresses from these steps to step 120 as described above.

[Step 120]

Since it is determined that the non-mercury battery 1 does not have a sufficient voltage (NG) as described later here, its warning is displayed via the display unit 10.

[Step 121]

In step 121, the camera is placed in a hold state and the CPU enters the wait state for switches to be turned on as described in the step 106.

The following describes a subroutine for the battery check operation including the battery activation performed in the above steps 104, 107, and 119 according to FIG. 3, referring to FIGS. 4A to 5B.

[Step 151]

In this step, the CPU connects the load consuming relatively much current compared with the current for a normal battery check described below to the non-mercury battery 1, to activate it (in other words, to remove the oxidation phenomenon to lower the internal resistance to a normal level).

According to this embodiment, the strobe circuit 5 which is an a.c. load is selected as a load for activating the battery. Not only this, however, can be selected, but also a special d.c. load for battery activation can be selected as a load therefor.

[Step 152]

In step 152, the CPU determines a period of time for energizing a load for battery activation, the strobe circuit 5 (or a load for battery activation 11) and then energizes the circuit during the time.

Figure 4A:
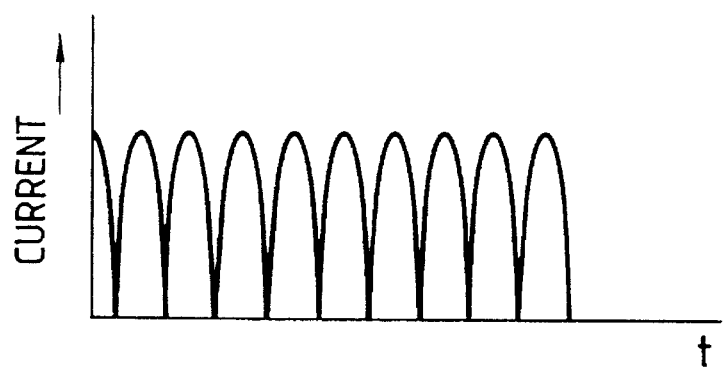
FIGS. 4A and 4B are timing charts showing examples of current statuses during energizing a load for battery activation in step 152 shown in FIG. 3.
Figure 4B:
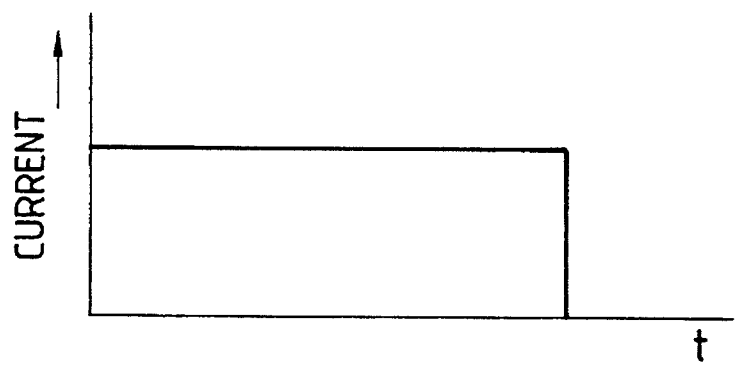

The period of time for energizing the strobe circuit 5 (or the load for battery activation 11) is changed according to the ambient operating temperature (the time for energizing at a lower temperature is longer than that for energizing at a higher temperature), the number of times for use (the number of times for taking photos), or a result of the normal battery check described below. FIGS. 4A and 4B illustrate the current statuses during energizing the load for battery activation; FIGS. 4A and 4B show a current waveform in the case of selecting the strobe circuit 5 and a current waveform in the case of selecting the load for battery activation 11, respectively.

Figure 5A:
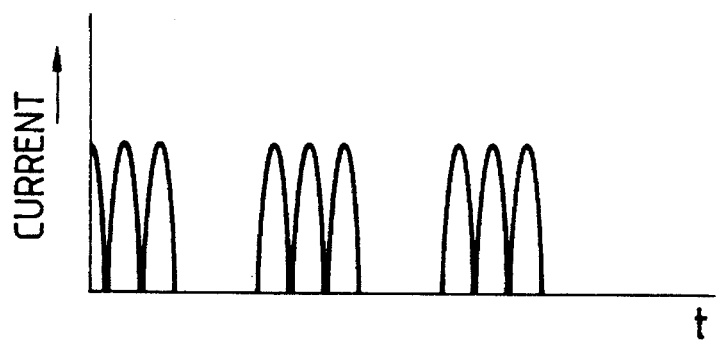
FIGS. 5A and 5B are timing charts showing other examples of current statuses during energizing a load for battery activation in step 152 in FIG. 3.
Figure 5B:
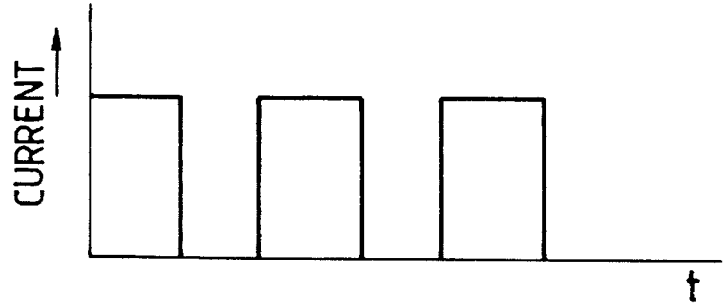

The load for battery activation can be energized not only continuously as shown in FIGS. 4A and 4B, but intermittently as shown in FIGS. 5A and 5B. As an experimental result, it is proved that the latter is more effective to activate a battery in a short time.

After the completion of energizing the load for battery activation for the predetermined time as described above, the control progresses to step 153.

[Step 153]

The load for battery activation, the strobe circuit 5 or the load for battery activation 11 is released from the non-mercury battery 1.

The above steps 151 to 153 covers the description of actuating a load for battery activation.

[Step 154]

In step 154, the shutter driving circuit 7, for example, is connected to the non-mercury battery 1 as a load for a normal battery check.

[Step 155]

The above-described shutter driving circuit 7 is energized for a predetermined time to detect a voltage across the non-mercury battery during the time.

[Step 156]

A load for the normal battery check, the shutter driving circuit 7 is released from the non-mercury battery 1.

[Step 157]

It is determined whether or not the subsequent operation can be continued with the battery voltage with comparison between the voltage across the non-mercury battery 1 in the step 155 and the battery life determination level. If the battery voltage is determined to be sufficient (OK), the control progresses to the next step as described in FIG. 2. Otherwise (NG), it progresses to step 120 in which a warning is displayed in any case.

The above steps 154 to 157 covers the description of the normal battery check for a battery life determination.

According to the first embodiment of the invention, prior to the normal battery check, the strobe circuit 5, for example, is connected to the non-mercury battery 1 and energized to some extent to remove the temporary oxidation of the internal substances, in other words, to activate the battery so as to achieve its original power, which prevents the battery from being determined to be defective in spite of its sufficient power as a result of the subsequent battery check and from being unnecessarily replaced with new one.

(The second embodiment)

Figure 6:
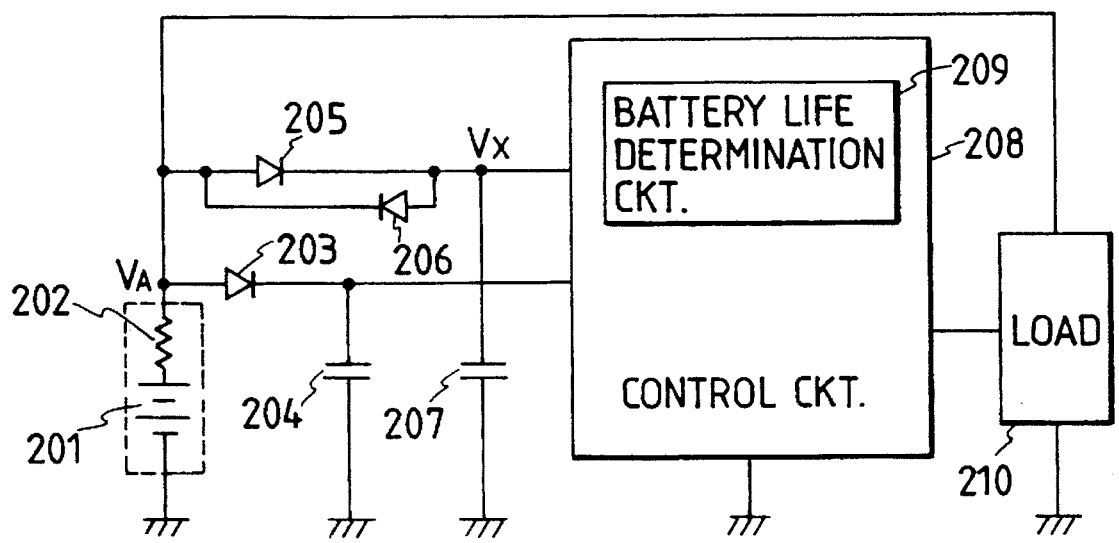
FIG. 6 is a circuit diagram illustrating a general construction of the battery check apparatus in the second embodiment of the present invention.

Referring to FIG. 6, a circuit diagram shows the main components of the battery check apparatus according to the second embodiment of the invention.

In FIG. 6, a non-mercury battery 201 is a power supply including an internal resistor 202, and the resistor 202 has characteristics that the resistance is increased at its initial use due to temporary oxidation of its internal substances, decreased to a normal level during continuous use of the battery, and then increased again due to battery drain as described in the first embodiment of the invention.

A diode 203 and a capacitor 204 constitute a circuit generating power for a control circuit described later.

A diode 205 has a function to prevent a voltage (electric charge) accumulated in a capacitor 207 which is described later from flowing in reverse at a rapid voltage drop due to loading on the non-mercury battery 201. A diode 206 has a function to prevent the voltage in the capacitor 207 from dropping to the same level as for that of the non-mercury battery 201 at its voltage drop, in other words, to increase the voltage by its voltage drop. The capacitor 207 generates a voltage $V_X$ compared with the battery life determination level in a battery life determination circuit which is described later.

A control circuit 208 controls various operations of the unit, including a battery life determination circuit 209 for determining a battery life of the non-mercury battery 201 by comparing the voltage $V_X$ across the capacitor 207 (a battery life determined voltage) with a single battery life determination level $V_{BCK}$. A load 210 is controlled by the control circuit 208 and it is also used for a battery check (battery life determination).

Character $V_A$ represents a voltage across the non-mercury battery 1.

Figure 7:
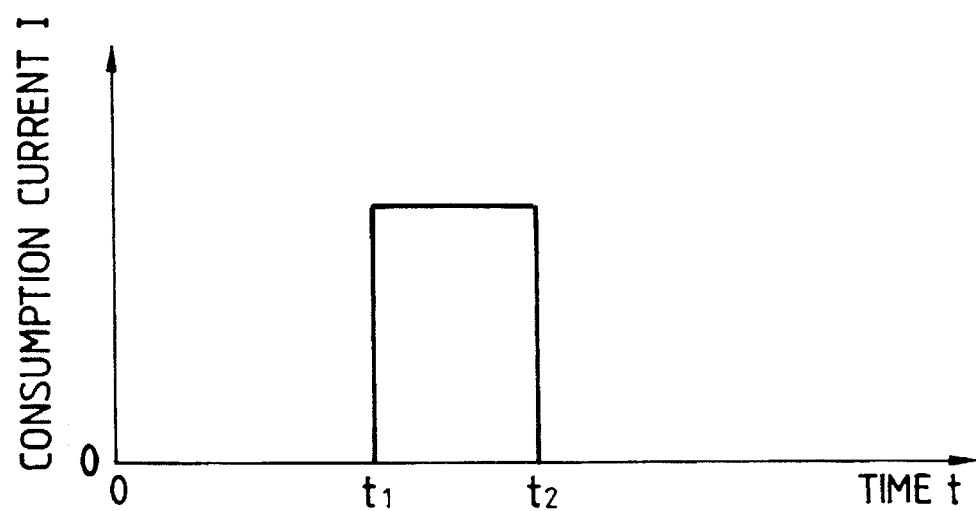
FIG. 7 is a diagram illustrating a state of the consumption current at actuating the load in FIG. 6 for a predetermined time.
Figure 8:
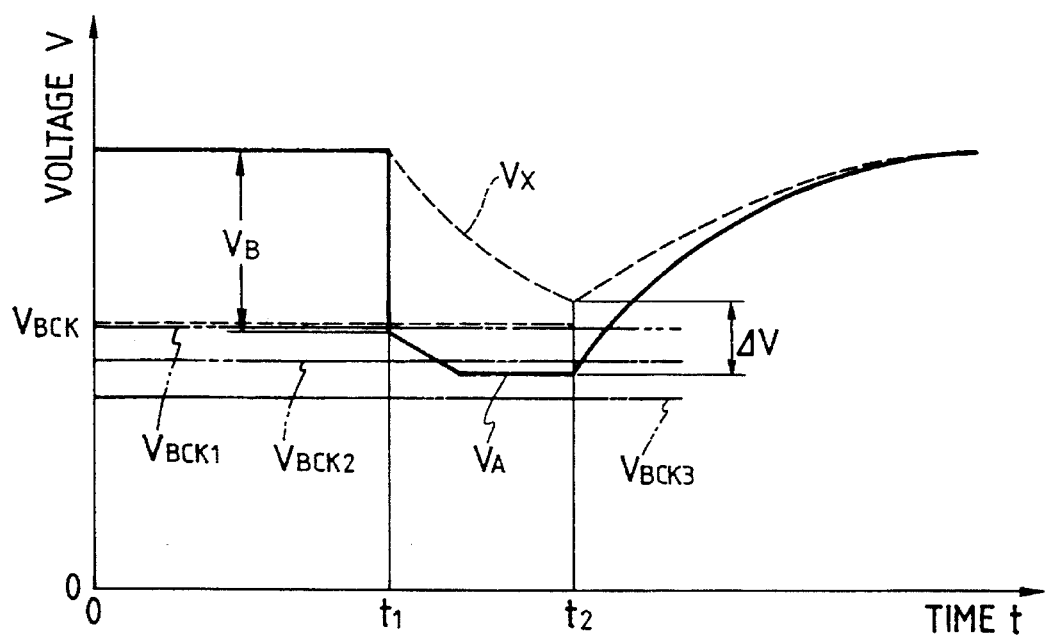
FIG. 8 is a diagram illustrating a state of a battery initial voltage $V_A$ and a battery life determined voltage $V_X$ at actuating the load in FIG. 6 for the predetermined time.

When the load 210 is actuated in this construction by the control circuit 208 during the time between time $t_1$ and time $t_2$ as shown in FIG. 7, the battery opened voltage $V_A$ and the battery life determined voltage $V_X$ change as shown in FIG. 8.

In other words, when the load 210 is actuated, on one hand the battery opened voltage $V_A$ is lower than the battery life determination level $V_{BCK}$ as represented by a solid line since the internal resistor 202 shows a higher resistance at the initial use of the non-mercury battery 1; on the other hand the battery life determined voltage $V_X$ is decreased gradually just to a level higher than the battery life determination level $V_{BCK}$, at an electric potential higher than the battery opened voltage $V_A$ by $\Delta V$, as represented by a dotted line due to time constants of the capacitor 207 and the internal resistor 202, which prevents the battery life determination circuit 209 from determining that the battery is defective at this time.

Figure 9:
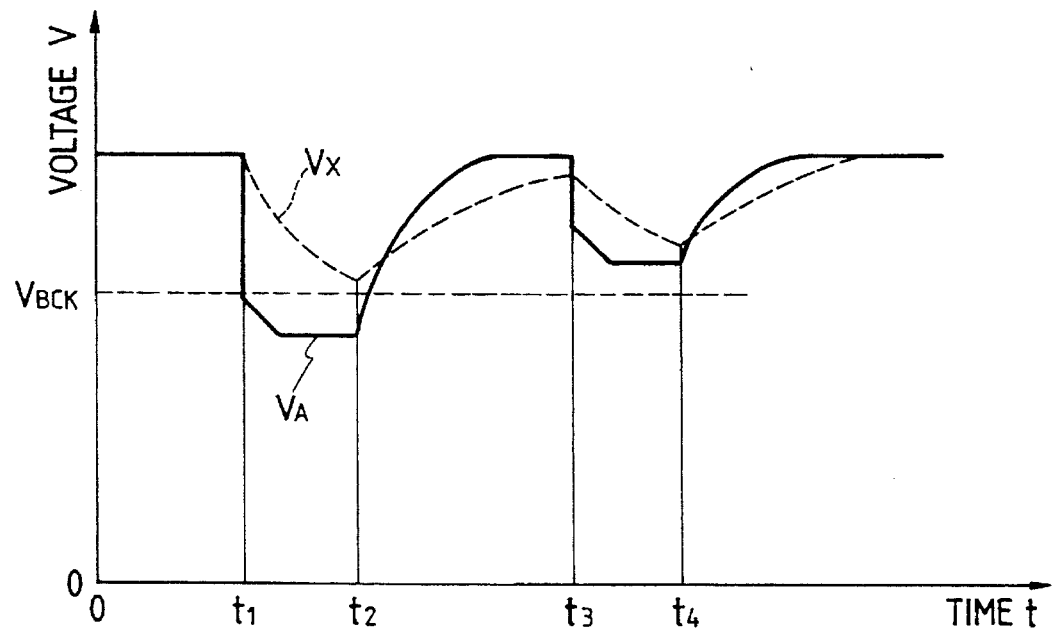
FIG. 9 is a diagram illustrating a state of the battery opened voltage $V_A$ and the battery life determined voltage $V_X$ at actuating the load twice for the predetermined time.

Referring to FIG. 9, there is shown states of the battery opened voltage $V_A$ and the battery life determined voltage $V_X$ obtained by the above battery life determining operation repeated twice.

As shown in FIG. 9, on one hand the battery opened voltage $V_A$ is lower than the battery life determination level $V_{BCK}$ at actuation of the load 210 between time $t_1$ and time $t_2$ due to a higher resistance of the internal resistor 202; on the other hand the voltage $V_A$ is higher than the battery life determination level $V_{BCK}$ at actuation of the load 210 between time $t_3$ and time $t_4$ due to a lower resistance of the internal resistor 202.

The following describes the difference between the conventional method and a method according to this embodiment.

In the conventional method of a battery check with the comparison between the single battery life determination level $V_{BCK}$ and the battery opened voltage $V_A$, a battery is determined to be defective at the first determination even if it will be determined to have enough power at the second or after battery check as shown in FIG. 9 when the power supply is the non-mercury battery 210 whose internal resistor 202 shows a higher resistance at its initial use, and a warning is displayed as a user's information.

According to the second embodiment, however, the capacitor 207 and the internal resistor 202 have effects that the battery life determined voltage $V_X$ compared with the battery life determination level $V_{BCK}$ is decreased just to the level at the higher potential than the battery opened voltage $V_A$ by $\Delta V$, which ensures a user to determine correctly whether or not the battery is defective in spite of a simple circuit construction.

Figure 10:
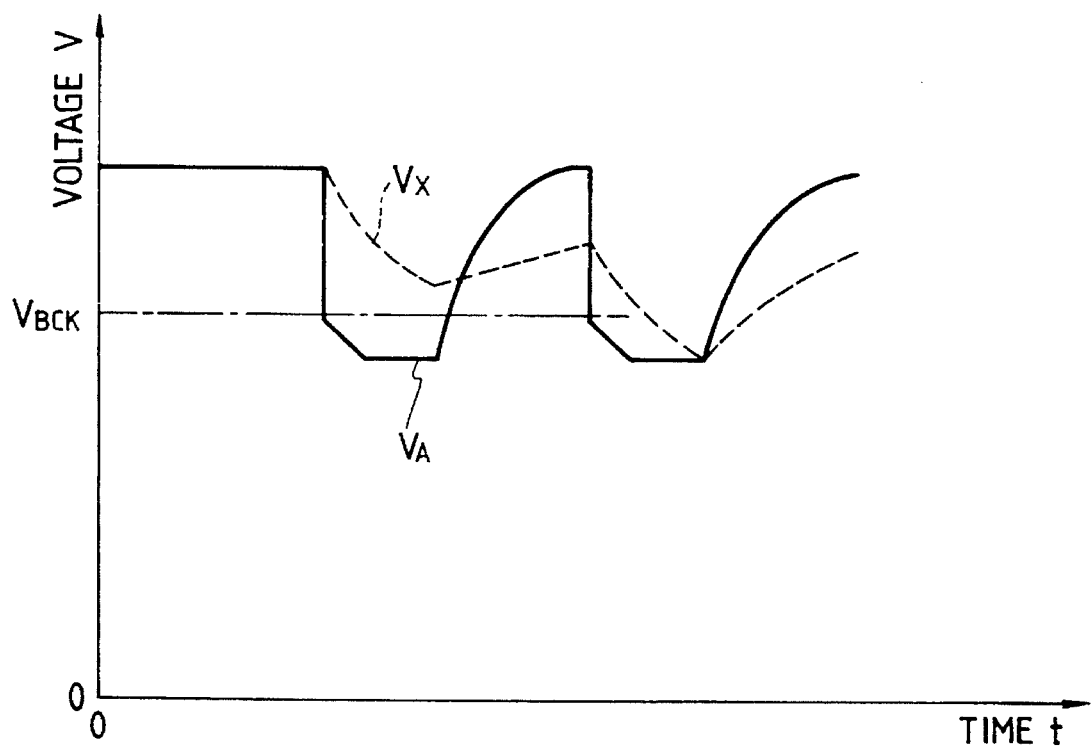
FIG. 10 is a diagram illustrating a state of the battery opened voltage $V_A$ and the battery life determined voltage $V_X$ at actuating the load twice for the predetermined time when the battery is drained of its power.

FIG. 10 shows states of the battery opened voltage $V_A$ and the battery life determined voltage $V_X$ at a battery check in which the internal resistor 202 shows a higher resistance again due to drain of the non-mercury battery 210 which does not have the original power.

Drain of the non-mercury battery 210 makes the resistance value always higher, which makes the electric potential ($V_X$) recovering due to time constants of the capacitor 207 and the internal resistor 202 lower at the second and subsequent determinations even if the battery is not determined to be defective at the first determination, so that the battery life determined voltage $V_X$ is lower than the battery life determination level $V_{BCK}$, and it is determined that the battery is defective by the battery life determination circuit 209. In other words, a defective battery can be detected without fail in the above case.

(The third embodiment)

Figure 11:
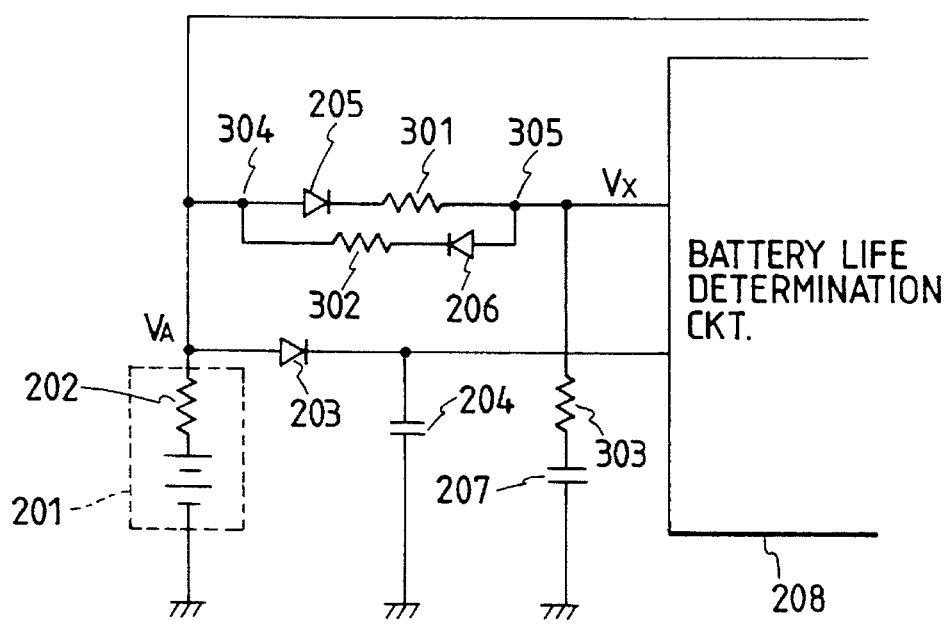
FIG. 11 is a circuit diagram illustrating main components of the battery check apparatus in the third embodiment of the present invention.

Referring to FIG. 11, a circuit diagram shows the main components of the battery check apparatus according to the third embodiment of the invention, and the same numerals are appended to the same portions as for FIG. 6.

Referring to FIG. 13, a resistor 301 is disposed between the diode 205 and the battery life determination circuit 208. A resistor 302 is placed between the non-mercury battery 201 and a diode 206. A resistor 303 is disposed between the capacitor 207 and the battery life determination circuit 208.

The resistor 301 and the resistor 302 can be disposed between diode 205 and a node 304 and between the diode 205 and a node 305, respectively. The resistor 303 can be placed between the capacitor 207 and the ground or between the non-mercury battery 201 and the node 304.

Figure 12:
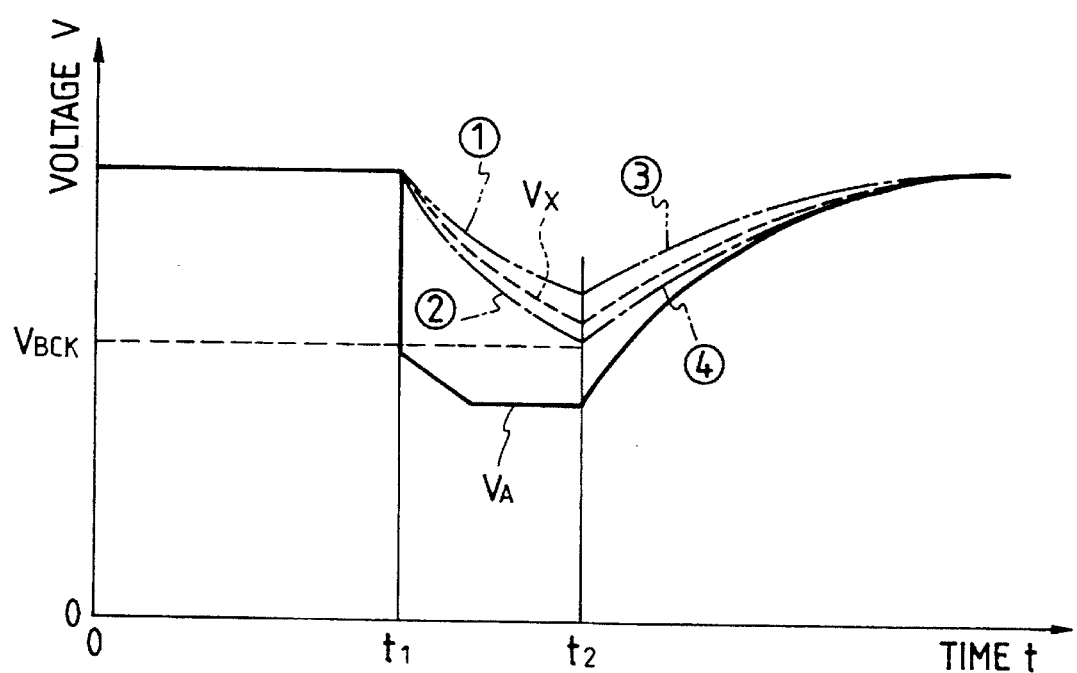
FIG. 12 is a diagram for describing the changes of the inclination developed on the battery life determined voltage $V_X$ by the arrangement of resistors in FIG. 11.

Disposing the resistor 301 and optionally selecting its resistance value changes an inclination (discharge rate) of the battery life determined voltage $V_X$ at the load actuation as represented by (1) or (2) in FIG. 12. In addition, disposing the above resistor 302 and optionally selecting its resistance value changes an inclination (recovery rate) of the battery life determined voltage $V_X$ at the completion of the load actuation as represented by (3) and (4) in FIG. 12.

Further, disposing the above resistor 303 and optionally selecting its resistance value changes the entire (at the load actuation and at the completion of the load actuation) inclination of the battery life determined voltage $V_X$. The same effect is obtained by changing the capacity of the capacitor 207.

One of the advantages of this construction is that it becomes possible to balance the unit by regulating the inclination of the battery life determined voltage $V_X$ when the battery life determination level $V_{BCK}$ is predetermined, for example.

That is, according to the above embodiments, in the battery life determining means to determine whether or not the battery life is sufficient by connecting the load to the battery which does not contain mercury compounds for a short time, there is provided battery activating means to activate the battery by giving enough load conditions to stabilize the chemical characteristics developed at its initial use so as to remove the temporary phenomenon before performing the above-described battery life determining operation and then to carry out the normal battery life determination.

Further, the battery check apparatus, comprising the battery life determined voltage generating means to generate a voltage depending on a change on the above-described battery voltage with a rapidly-change of the battery voltage at the load connection to a non-mercury battery moderated by an internal resistance thereof and the battery life determination means to determine a life of the above-described battery with comparison between the battery life determined voltage and the predetermined battery life determination voltage, does not treat the rapidly-changed battery voltage caused by a higher internal resistance of the battery due to a temporary chemical change, but treats the voltage moderated from the rapidly-changed voltage as a battery life determined voltage.

Accordingly, it becomes possible to determine correctly a life of the battery which does not contain mercury compounds in spite of a simple construction.

It is needless to say that this invention can be widely applied to batteries other than non-mercury batteries if their internal resistance values are higher at their initial use.

Further, needless to say, it is also applicable to apparatuses other than cameras if they need a battery check.

The individual components shown in schematic or block form in the Drawings are all well-known in the camera arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A battery check apparatus, comprising:
   (A) decreasing means for decreasing an internal resistance of a battery;
   (B) checking means for checking the battery the internal resistance of which has been decreased by said decreasing means.

2. An apparatus according to claim 1, wherein the decreasing means comprises means for connecting a load to the battery.

3. An apparatus according to claim 2, wherein the load comprises a d.c. load.

4. An apparatus according to claim 2, wherein the load comprises an a.c. load.

5. An apparatus according to claim 2, wherein the load comprises a unit driven by the battery.

6. An apparatus according to claim 2, wherein the load comprises a flashlight unit.

7. An apparatus according to claim 2, wherein the load comprises a load different from a unit driven by the battery.

8. An apparatus according to claim 2, wherein said decreasing means comprises means for connecting the load a number of times.

9. An apparatus according to claim 8, wherein said decreasing means comprises means for connecting the load for a period of time.

10. An apparatus according to claim 2, wherein said decreasing means comprises means for connecting the load for a period of time.

11. An apparatus according to claim 1, wherein said decreasing means comprises means for employing the battery for a number of times to decrease the internal resistance thereof.

12. An apparatus according to claim 11, wherein said decreasing means comprises means for employing the battery for a period of time to decrease the internal resistance thereof.

13. An apparatus according to claim 1, wherein the decreasing means comprises means for employing the battery for a period of time to decrease the internal resistance thereof.

14. An apparatus according to claim 1, wherein said checking means comprises means for checking a capacity of the battery after causing said decreasing means to function a number of times.

15. An apparatus according to claim 14, wherein said checking means comprises means for checking the capacity of the battery after causing said decreasing means to function for a period of time.

16. An apparatus according to claim 1, wherein said checking means comprises means for checking the capacity of the battery after causing said decreasing means to function for a period of time.

17. An apparatus according to claim 1, wherein said decreasing means comprises means for determining a condition thereof.

18. An apparatus according to claim 1, wherein said decreasing means comprises means for determining a period of time for application.

19. An apparatus according to claim 1, wherein said decreasing means comprises means for determining a condition for application according to a temperature.

20. An apparatus according to claim 1, wherein said decreasing means comprises means for determining a condition for application according to a number of times for using the battery.

21. An apparatus according to claim 1, wherein said decreasing means comprises means for determining a period of time for application according to a temperature.

22. An apparatus according to claim 1, wherein said decreasing means comprises means for determining a period of time for application according to a number of times for using the battery.

23. An apparatus according to claim 1, wherein the battery comprises a battery which does not contain mercury compounds.

24. An apparatus according to claim 1, wherein the battery comprises a battery whose internal resistance is high at its initial use.

25. An apparatus according to claim 1, wherein the power supply battery comprises a battery used for a camera.

26. An apparatus according to claim 1, wherein said decreasing means comprises means for activating the battery.

27. An apparatus according to claim 1, wherein said decreasing means comprises means for removing internal oxidation of the battery.

28. An apparatus according to claim 1, wherein the checking means comprises erroneous determination preventing means for preventing the capacity of the battery from being determined incorrectly during functioning of said decreasing means.

29. An apparatus according to claim 28, wherein the erroneous determination preventing means comprises a capacitor.

30. An apparatus according to claim 29, wherein said erroneous determination preventing means comprises a diode.

31. An apparatus according to claim 28, wherein said erroneous determination preventing means comprises a diode.

32. An apparatus according to claim 29, wherein said erroneous determination preventing means comprises a resistor.

33. An apparatus according to claim 29, wherein said erroneous determination preventing means comprises a resistor for regulation.

34. An apparatus according to claim 28, wherein said erroneous determination preventing means comprises a resistor.

35. An apparatus according to claim 28, wherein the erroneous determination preventing means comprises resistors for regulation.

36. An apparatus according to claim 1, wherein said checking means comprises a capacitor.

37. An apparatus according to claim 36, wherein said checking means comprises a diode.

38. An apparatus according to claim 36, wherein said checking means comprises a resistor.

39. An apparatus according to claim 36, wherein said checking means comprises a resistor for regulation.

40. An apparatus according to claim 1, wherein said checking means comprises a diode.

41. An apparatus according to claim 1, wherein said checking means comprises a resistor.

42. An apparatus according to claim 1, wherein said checking means comprises a resistor for regulation.

43. An apparatus for which a battery is used, comprising:
(A) decreasing means for decreasing an internal resistance of a battery;
(B) checking means for checking the battery the internal resistance of which has been decreased by said decreasing means.

44. An apparatus according to claim 43, wherein the decreasing means comprises means for connecting a load to the battery.

45. An apparatus according to claim 44, wherein the load comprises a d.c. load.

46. An apparatus according to claim 44, wherein the load comprises an a.c. load.

47. An apparatus according to claim 44, wherein the load comprises a unit driven by the battery.

48. An apparatus according to claim 44, wherein the load comprises a flashlight unit.

49. An apparatus according to claim 44, wherein the load comprises a load different from a unit driven by the battery.

50. An apparatus according to claim 44, wherein said decreasing means comprises means for connecting the load a number of times.

51. An apparatus according to claim 50, wherein said decreasing means comprises means for connecting the load for a period of time.

52. An apparatus according to claim 44, wherein said decreasing means comprises means for connecting the load for a period of time.

53. An apparatus according to claim 44, wherein said decreasing means comprises means for employing the battery for a number of times to decrease the internal resistance thereof.

54. An apparatus according to claim 53, wherein said decreasing means comprises means for employing the battery for a period of time to decrease the internal resistance thereof.

55. An apparatus according to claim 43, wherein said decreasing means comprises means for affecting the battery for a period of time to decrease the internal resistance thereof.

56. An apparatus according to claim 43, wherein said checking means comprises means for checking a capacity of the battery after causing said decreasing means to function a number of times.

57. An apparatus according to claim 56, wherein said checking means comprises means for checking capacity of the battery after causing said decreasing means to function for a period of time.

58. An apparatus according to claim 43 wherein said checking means comprises means for checking the capacity of the battery after causing said decreasing means to function for a period of time.

59. An apparatus according to claim 43, wherein said decreasing means comprises means for determining a condition thereof.

60. An apparatus according to claim 43, wherein said decreasing means comprises means for determining a period of time for application.

61. An apparatus according to claim 43, wherein said decreasing means comprises means for determining for application according to a temperature.

62. An apparatus according to claim 43, wherein said decreasing means comprises means for determining a condition for application according to a number of times for using the battery.

63. An apparatus according to claim 43, wherein said decreasing means comprises means for determining a period of time for application according to a temperature.

64. An apparatus according to claim 43, wherein said decreasing means comprises means for determining a period of time for application according to a number of times for using the battery.

65. An apparatus according to claim 43, wherein the battery comprises a battery which does not contain mercury compounds.

66. An apparatus according to claim 43, wherein the battery comprises a battery whose internal resistance is high at its initial use.

67. A camera, comprising:

(A) decreasing means for decreasing an internal resistance of a battery;

(B) checking means for checking the battery the internal resistance of which has been decreased by said decreasing means.

68. An apparatus according to claim 67, wherein the decreasing means comprises means for connecting a load to the battery.

69. Art apparatus according to claim 68, wherein the load comprises a d.c. load.

70. An apparatus according to claim 68, wherein the load comprises an a.c. load.

71. An apparatus according to claim 68, wherein the load comprises a unit driven by the battery.

72. An apparatus according to claim 68, wherein the load comprises a flashlight unit.

73. An apparatus according to claim 68, wherein the load comprises a load different from a unit driven by the battery.

74. An apparatus according to claim 68, wherein said decreasing means comprises means for connecting the load a number of times.

75. An apparatus according to claim 74, wherein said decreasing means comprises means for connecting the load for a period of time.

76. An apparatus according to claim 68, wherein said decreasing means comprises means for connecting the load for a period of time.

77. An apparatus according to claim 67, wherein said decreasing means comprises means for employing the battery for a number of times to decrease the internal resistance thereof.

78. An apparatus according to claim 77, wherein said decreasing means comprises means for employing the battery for a period of time to decrease the internal resistance thereof.

79. An apparatus according to claim 67, wherein said decreasing means comprises means for employing the battery for a period of time to decrease the internal resistance thereof.

80. An apparatus according to claim 67, wherein said checking means comprises means for checking a capacity of the battery after causing said decreasing means to function a number of times.

81. An apparatus according to claim 80, wherein said checking means comprises means for checking the capacity of the battery after causing said decreasing means to function for a period of time.

82. An apparatus according to claim 67, wherein said checking means comprises means for checking the capacity of the battery after causing said decreasing means to function for a period of time.

83. An apparatus according to claim 67, wherein said decreasing means comprises means for determining a condition thereof.

84. An apparatus according to claim 67, wherein said decreasing means comprises means for determining a period of time for application.

85. An apparatus according to claim 67, wherein said decreasing means comprises means for determining a condition for application according to a temperature.

86. An apparatus according to claim 67, wherein said decreasing means comprises means for determining a condition for application according to a number of times for using the battery.

87. An apparatus according to claim 67, wherein said decreasing means comprises means for determining a period of time for application according to a temperature.

88. An apparatus according to claim 67, wherein said decreasing means comprises means for determining a period of time for application according to a number of times for using the battery.

89. A camera according to claim 67, wherein the battery comprises a battery which does not contain mercury compounds.

90. A camera according to claim 67, wherein the battery comprises a battery whose internal resistance is high at its initial use.

* * * * *

UNITED STATES PATENT AND TRADEMARK OFFICE
CERTIFICATE OF CORRECTION

PATENT NO. : 5,527,630
DATED : June 18, 1996
INVENTOR(S) : Toshio Nagata, et al.

It is certified that error appears in the above-indentified patent and that said Letters Patent is hereby corrected as shown below:

On the cover page, Item [57], lines 2-3, change "an effecting circuit for effecting the power supply battery to decrease" to -- a decreasing circuit for decreasing -- and change "battery power supply" to -- power supply battery --.

On the cover page, Item [57], line 5, change "effecting" to -- decreasing --.

Col. 2, line 2, change "opened" to -- initial --.

Col. 2, line 5, change "opened" to -- initial --.

Col. 2, line 20, after "FIG. 1" insert -- , --.

Col. 4, line 52, change ";" to -- . --.

Col. 5, line 1, change "covers" to -- cover --.

Col. 6, line 3, change "opened" to -- initial --.

Col. 6, line 7, change "opened" to -- initial --.

Col. 6, line 10, change "1;on" to -- 1. On --.

Col. 6, line 13, change "opened" to -- initial --.

Col. 6, line 19, change "opened" to -- initial --.

Col. 6, line 22, change "opened" to -- initial --.

UNITED STATES PATENT AND TRADEMARK OFFICE
CERTIFICATE OF CORRECTION

PATENT NO.   :   5,527,630                                         Page 2
DATED        :   June 18, 1996
INVENTOR(S)  :   Toshio Nagata, et al.

It is certified that error appears in the above-indentified patent and that said Letters Patent is hereby corrected as shown below:

```
Col. 6, line 34, change "opened" to -- initial --.
Col. 6, line 37, change "after" to -- later --.
Col. 6, line 45, change "opened" to -- initial --.
Col. 6, line 49, change "opened" to -- initial --.
Col. 7, line 67, change "Drawings" to -- drawings --.
Col. 9, line 55, change "the" to -- said --.
Col. 9, line 56, after "comprises" insert -- a --.
Col. 9, line 57, change "tors" to -- tor --.
```

Signed and Sealed this

Twenty-fifth Day of February, 1997

Attest:

BRUCE LEHMAN

*Attesting Officer*        *Commissioner of Patents and Trademarks*